United States Patent
Pretsch et al.

(10) Patent No.: US 11,377,115 B2
(45) Date of Patent: Jul. 5, 2022

(54) METHOD FOR TESTING AT LEAST ONE CONTROL DEVICE FUNCTION OF AT LEAST ONE CONTROL DEVICE

(71) Applicant: dSPACE GmbH, Paderborn (DE)

(72) Inventors: Christian Pretsch, Altenbeken (DE); Hendrik Amelunxen, Altenbeken (DE)

(73) Assignee: DSPACE GMBH, Paderborn (DE)

( * ) Notice: Subject to any disclaimer, the term of this patent is extended or adjusted under 35 U.S.C. 154(b) by 520 days.

(21) Appl. No.: 16/480,198

(22) PCT Filed: Jan. 22, 2018

(86) PCT No.: PCT/EP2018/051430
§ 371 (c)(1),
(2) Date: Jul. 23, 2019

(87) PCT Pub. No.: WO2018/134398
PCT Pub. Date: Jul. 26, 2018

(65) Prior Publication Data
US 2020/0001888 A1    Jan. 2, 2020

(30) Foreign Application Priority Data
Jan. 23, 2017  (EP) .................... 17152600

(51) Int. Cl.
*B60W 50/04*   (2006.01)
*G05B 17/02*   (2006.01)
*B60W 50/00*   (2006.01)

(52) U.S. Cl.
CPC ............ *B60W 50/04* (2013.01); *G05B 17/02* (2013.01); *B60W 2050/0031* (2013.01)

(58) Field of Classification Search
CPC .......... B60W 50/04; B60W 2050/0031; G05B 17/02
See application file for complete search history.

(56) References Cited

U.S. PATENT DOCUMENTS 9,606,539 B1 *  3/2017  Kentley ............... G05D 1/0027
10,459,444 B1 * 10/2019 Kentley-Klay ...... G05D 1/0027
(Continued)

FOREIGN PATENT DOCUMENTS

DE        10042559 A1    1/2002
DE      102010043661 A1   5/2012
(Continued)

OTHER PUBLICATIONS

Extended Search Report for EP Application No. 17152600.7, dated Jul. 12, 2017.
(Continued)

*Primary Examiner* — Peter D Nolan
*Assistant Examiner* — Wae L Louie
(74) *Attorney, Agent, or Firm* — Orrick, Herrington & Sutcliffe LLP; Joseph A. Calvaruso; Richard F. Martinelli

(57) ABSTRACT

A simulator and a method for testing a control device function of a control device of a vehicle. The vehicle includes various environmental sensors, such as radar, a camera, and a radio receiver, which serve as inputs to the control device function of the control device. A corresponding simulation utilizing a vehicle model sensor models, and an environmental model is executed in a distributed fashion via a plurality of computing units and a memory of a simulator. The simulation utilizing the vehicle model, the sensor models, and the environmental model provides inputs to the control device function. Moreover, the simulation utilizing these models is started synchronously on the computing units, wherein data exchange occurs amongst the memory and the multiple computing units.

12 Claims, 9 Drawing Sheets

(56) References Cited

U.S. PATENT DOCUMENTS

| | | | |
|---|---|---|---|
| 10,929,711 B1* | 2/2021 | Pfeiffer | G06N 20/00 |
| 2005/0273218 A1* | 12/2005 | Breed | G07C 5/085 |
| | | | 701/2 |
| 2010/0100365 A1 | 4/2010 | Moriyama | |
| 2010/0312364 A1* | 12/2010 | Eryilmaz | G05B 11/42 |
| | | | 715/833 |
| 2011/0066262 A1* | 3/2011 | Kelly | G05B 23/0267 |
| | | | 703/17 |
| 2015/0019266 A1* | 1/2015 | Stempora | G06Q 40/08 |
| | | | 705/4 |
| 2015/0346722 A1* | 12/2015 | Herz | G01S 19/13 |
| | | | 701/2 |
| 2016/0314224 A1* | 10/2016 | Wei | G05D 1/0088 |
| 2016/0321037 A1 | 11/2016 | Ono et al. | |
| 2019/0387060 A1* | 12/2019 | Kentley-Klay | H04L 67/18 |
| 2020/0001888 A1* | 1/2020 | Pretsch | G06F 30/20 |
| 2020/0065443 A1* | 2/2020 | Liu | G06F 11/3664 |
| 2021/0073584 A1* | 3/2021 | St. Romain, Ii et al. | |
| | | | G06N 3/088 |

FOREIGN PATENT DOCUMENTS

| | | |
|---|---|---|
| DE | 102015207054 A1 | 10/2016 |
| JP | 2012-137332 A | 7/2012 |
| JP | 2012-529101 A | 11/2012 |

OTHER PUBLICATIONS

International Search Report and Written Opinion for PCT/EP2018/051430, dated Apr. 12, 2018.

Pereira, An Integrated Architecture for Autonomous Vehicles Simulation, Faculdade de Engenharia da Universidade do Porto, Mestrado Integrado em Engenharia Electrotécnica e de Computadores, Jun. 2011.

Potuzak et al., Use of Distributed Traffic Simulation in the JUTS Project, IEEE, 2007, pp. 314-319.

Office Action for Japanese application No. JPO 2018-008039, dated Aug. 16, 2021.

Office Action for European application No. 18700684.6, dated Oct. 6, 2021.

* cited by examiner

METHOD FOR TESTING AT LEAST ONE CONTROL DEVICE FUNCTION OF AT LEAST ONE CONTROL DEVICE

CROSS-REFERENCE TO RELATED APPLICATIONS

This application is a national stage filing of International Patent Application No. PCT/EP2018/051430, filed on Jan. 22, 2018, which claims priority to European Patent Application No. 17152600.7, filed on Jan. 23, 2017, the contents of which are incorporated herein by reference in their entireties and for all purposes.

FIELD OF THE INVENTION

The invention generally relates to a method for testing at least one control device function of at least one control device of at least one first vehicle by means of a simulator.

BACKGROUND OF THE INVENTION

The field of control device development, the development of control device functionalities and the testing thereof includes the computer assisted and model based development of control device functionalities, ranging as far as the implementation of the control device functionalities on the series control devices which are ultimately used, and has been known for many years. One established procedure is referred to as the V model. Here, control device functionalities are initially developed in a simulation environment which does not have any similarity with the hardware of the control device which is used later, and which is completely decoupled from the actual physical process, for example a vehicle. The resulting functionalities can be implemented on a powerful development control device and tested in the real process. Finally, the control device functionality is transferred to the target hardware which will be ultimately used, that is to say the series control device, the hardware of which is matched—also with respect to cost criteria—and optimized to the technical process to be influenced.

The testing of control devices may also take place within the scope of what is referred to as hardware in the loop simulation (HIL simulation) in conjunction with high performance simulators which simulate the surroundings of the control device to be tested and of the control device functionality implemented in the control device, by using mathematical models. If the control device which is to be tested is actually present in a real form, such simulators are also able to output the simulated environmental data to the control device via corresponding I/O interfaces. Conversely, signals which are output by the control device can also be received via corresponding I/O interfaces and supplied to the model which is calculated in the simulator.

It is of great interest to test the control device functionality as early as possible with the control device software which is actually used. For this purpose, the procedure has in the meantime been adopted of also using a mathematical model to model and simulate the series-control device, that is to say the control device hardware or at least the software which is close to the hardware. Such a control device can be simulated at varying levels physical detail. Since it is not present in a real form, the term virtual control device (VECU=Virtual Electronic Control device) is frequently used here.

It is noted that the simulator, via the HIL-simulation, simulates sensor outputs for a simulated environment within which the control device functionality of the control device is to be tested. As such, the simulator simulates signals of a sort understood by the control device. If, for example, the control device is an engine control device, such signals are typically ones which correspond to engine control. As examples, such signals can include ones relating to crankshaft/connecting rod rotational angle, valve position, cylinder head temperature, and accelerator pedal position, to name just a few. Thus, in essence, the simulator generates sensor data of the kind which would typically be provided by sensors which capture internal vehicle conditions.

A comparatively new technology is concerned with the use of environmental sensors in a vehicle, that is to say sensors which do not actually sense internal state variables of the vehicle but instead sense the surroundings of a vehicle and generate corresponding sensor data. A non-exclusive list of examples of such environmental sensors can include (i) radar sensors which supply distance information with high accuracy, (ii) optical sensors including cameras, the sensor data from which can be used to analyze the captured traffic situation (thereby making available available, for example, information about the road signs in the surroundings), and (iii) antennas having evaluation electronics which sense and evaluate the information output by surrounding vehicles, with respect to the position and movement of these vehicles. This list is illustrative only, as the variety of environmental sensors which can be used is as broad as the types, amounts and characteristics of the information which the surroundings of one or more vehicles may be expected to manifest.

The use of environmental sensors frequently plays a role within the scope of driver assistance systems (ADAS=Advanced Driver Assistance Systems) or autonomous vehicle control systems (HAD=Highly Automated Driving). It is readily apparent that environmental sensors frequently have to acquire and process an immense quantity of data. The simulation of entire surroundings of a control device which is installed in a vehicle and is supplied with sensor data from environmental sensors is also correspondingly demanding. In this context, the control device does not necessarily have to be supplied with sensor data from environmental sensors of the vehicle in question (referred to as the first vehicle at the beginning), though can be that the control device is supplied with the sensor data from environmental sensors of further vehicles, which data is received, for example, via the previously addressed antenna of the first vehicle.

BRIEF SUMMARY OF THE INVENTION

The invention relates to a method for testing at least one control device function of at least one control device of at least one first vehicle by means of a simulator having a plurality of computing units, wherein the first vehicle has at least one environmental sensor, wherein a multiplicity of environmental sensors of the first vehicle and/or of at least one further vehicle supply the at least one control device and/or further control devices with sensor data of the environmental sensors, the at least one control device function processes at least some of the sensor data as input variables, and the first vehicle and, if present, the further vehicles are located in surroundings which represent a traffic situation, wherein the first vehicle is simulated by means of a first vehicle model, and, if present, the further vehicles are simulated by means of further vehicle models, the environmental sensors are simulated by means of sensor models, and the surroundings are simulated by means of an environmental model with the computing units of the simulator, wherein the models are distributed alone or in groups between at least two computing units, each with a directly accessible memory, wherein the environmental model comprises static environmental data and dynamic environmental data, wherein the sensor models have, as input variables, the static environmental data and/or dynamic environmental data. Furthermore, the invention relates to a simulator for carrying out the method according to the invention.

The location and number of the environmental sensors, and how many control devices and control device functions they supply, can vary. For example, a plurality of environmental sensors can be installed in one vehicle, but also in each case one environmental sensor can also be installed in at least two different vehicles. The respective two environmental sensors can supply different control devices, or they can also supply only a single control device.

The use of environmental sensors which sense the surroundings of the vehicle in which they are installed (here the term "surroundings" is therefore also used in its everyday meaning and not only signal-referenced meaning), makes it necessary during a simulation to model mathematically all the components involved. Therefore, the first vehicle is modeled and simulated mathematically by means of a first vehicle model. Furthermore, further vehicles which are present can be mapped mathematically by means of further vehicle models, wherein the depth of the modeling of the vehicle models can vary. The environmental sensors of the first vehicle and/or of the further vehicles are described by means of mathematical sensor models and in this way made accessible to a simulation. Likewise, the surroundings in which the vehicles move and which therefore usually represent a traffic situation are mapped mathematically with an environmental model. All the mathematical models are then simulated with the computing units of the simulator, with chronological matching to one another. Owing to the size and complexity of the mathematical models and their requirement—at any rate in the case of classic HIL tests—to be able to calculate the mathematical models in real time, simulators with a plurality of computing units are frequently used for the simulation. The computing units are usually each stand-alone processor boards with a separate memory. The computing units can exchange information with one another via an external data bus and have to also exchange information within the scope of the simulation, since the various models are, of course, not independent of one another. A plurality of stand-alone computers with their own computing units and with a memory which can be accessed directly there by the respective computing units are also conceivable, wherein the computers are coupled to one another for the exchange of data. A processor with a plurality of computing cores is also equally possible, wherein each computer core is considered to be a computing unit. Of course the position of the vehicle is of interest for the calculation of the vehicle model, and the associated traffic situation which results from the environmental model. Likewise, the calculation of the sensor models is dependent on the position of the vehicle in the surroundings as well as also on dynamic properties of the vehicle movement which follows from the calculation of the vehicle model.

The environmental model of course comprises static and dynamic environmental data. The static environmental data includes all the objects in the surroundings which do not vary over time (routing of the road, buildings, signage, but also statistical dimensions of road users). The dynamic environmental data then includes the movement data of other vehicles or, for example, of pedestrians. The environmental model also permits, for example, the calculation of the position data of road users on the basis of the environmental data. The decisive part of the environmental data is the statistical environmental data.

Methods are known with which surrounding simulations can be carried out for testing the control device (dSPACE GmbH: "ASM Traffic, dSPACE Automotive Simulation Models (ASM)", product brochure 2016). Surroundings, i.e. a traffic situation, are produced here by a user by the selection of objects (road elements, road signs, road users etc. . . . ) and are combined to form overall surroundings. The selection during the combination of the surroundings gives rise to a description of the surroundings in a raw format of the environmental data. This facilitates the production a single uniform model for complex surroundings.

Furthermore, it is also possible to import a description of surroundings, for example a description in the so called OpenDRIVE format. This format would also constitute a raw format according to the present disclosure. Typically, for simulation purposes the data which is present in a raw format has to be converted into a data structure format. Under certain circumstances, in the case of imported data a further conversion of the data would also be performed, specifically the conversion of the imported (raw) data from the OpenDRIVE format into raw data or objects of the environmental modeling tool.

An aspect of the present disclosure is to further develop the method specified above for testing the control device function of a control device in such a way that the simulator hardware which is employed is used as advantageously as possible, or to make available a simulator which is configured to carry out the method according to the present disclosure.

This aspect is, in part, firstly achieved with the method described above by virtue of the sensor models being distributed between at least two computing units, each with their directly accessible memories, that there is identification of those computing units which have sensor models which have static environmental data as input variables, that the static environmental data is stored in the directly accessible memories of the identified computing units, that, after the storage of the static environmental data has been completed, the simulation of the models on the computing units with their respectively directly accessible memories is started synchronously, and that the sensor models which have the static environmental data as input variables use the static environmental data of that identified computing unit which has its directly accessible memory models on which the respective sensor models are themselves located.

The noted identification of the computing units can include detecting or determining those computing units on which sensor models having static data as input variables are executed. There are various procedures for this. Usually, a system description is provided for a system with a plurality of computing units. For example, the corresponding information as to which computing units which sensor models are to be calculated on can be obtained from this description. Another possible procedure would be to interrogate predefinitions in the models stored by the user.

The method according to the present disclosure is advantageous in many respects. The distribution of the sensor models between at least two computing units initially causes the computing load for the individual computing units to drop, at any rate measured for the case in which all the sensor models are calculated on a single computing unit. The measure according to which the static environmental data is stored on all those computing units, and their directly accessible memories, whose sensor models operate with static environmental data as input variables gives rise to an essential reduction in the exchange of data since the static environmental data is already located at the locations at which it is needed for calculation. As a result, the scope of data to be exchanged between various computing units is quite considerably reduced. Under certain circumstances, dynamic environmental data still then has to be exchanged between the computing units, but this involves only comparatively very small amounts of data compared to the static environmental data. The fact that the sensor models which have static environmental data as input variables operate with the static environmental data which is located on the computing unit or its directly accessible memory at which the sensor models are also themselves located has the overall effect that during the simulation there is no need to transmit static environmental data between the computing units of the simulator.

According to one preferred refinement of the method, there is provision that before the start of the simulation the static environmental data is transformed from a raw format into a data structure format. Raw format of the static environmental data is a data description of the static surroundings which is not adapted to the simulation surroundings of the simulator (software) or to the equipment level of the simulator and its computing units (hardware). It can simply comprise, for example, a long vector of double values. The conversion of this raw data into a data structure format which is understood by the simulation surroundings of the simulator is relatively complicated and time-consuming. The development of the method can speed up the simulation by virtue of the fact that the transformation of the static environmental data from the raw format into the data structure format takes place beforehand and is no longer a part of the simulation, for example no longer part of the environmental model. This provides a further advantage; conventionally, sensor models which utilized large quantities of static environmental data were executed on the same processor cores as the environmental model. This is because, according to conventional approaches, such sensor models exchanged with the environmental models quantities of data which were so great as to exceed interprocessor data exchange capacities within the scope of a multiprocessor simulation. However, according to the approaches discussed herein, such sensor models now exchange with environmental models quantities of data which no longer exceed such interprocessor data exchange capacities. Therefore, such sensor models can now be calculated on different processor cores than the environmental model. Accordingly, there can be a more flexible distribution of the sensor models between the processors of the simulator, irrespective of the positioning of the environmental model.

Two examples of information in a data structure format are specified below. The first example shows the description of a road sign:

```
struct traffic_sign /* traffic signs and traffic lights */
{
    int_T sign_type; /* type of sign: 1=light, 2=priority, 3=speed,
    4=overtake, ... */
    int_T sign_value; /* specification of sign or signal */
    int_T sign_id; /* unique sign identifier */
    int_T sign_cond; /* condition of traffic sign (visibility, dirt,
    aging) 0..100 */
};
```

The second example relates to a data structure which describes the contours of a road user:

```
struct box_dimension /* dimension of bounding box */
{
    real_T center_x; /* position vector (main point to center point)
    x-coordinate */
    real_T center_y; /* " y */
    real_T center_z; /* " z */
    real_T length_x; /* length of box in x direction */
    real_T length_y; /* " y */
    real_T length_z; /* " z */
};
```

One advantageous further development of the preliminary transformation of the static environmental data consists in the fact that before storage in the directly accessible memory of the identified computer units, the static environmental data is transformed from a raw format into a data structure format on a host computer. This additionally relives the loading on the simulator.

According to an alternative refinement of the method there is provision that, after storage in the directly accessible memory of an identified computing unit or in the directly accessible memories of a plurality of identified computing units, the static environmental data is transformed from a raw format into a data structure format by the respective computing unit, for example by virtue of the fact that a corresponding transformation function is made available at the respective computing unit. The advantage of this procedure is that during the conversion the correct data formats are generated virtually automatically, that is to say, for example, double values which satisfy the requirements of the respective computing unit used as the basis are generated with the correct length.

Apart from the treatment of the static environmental data or the execution of the transformation of the static environmental data from a raw format into a data structure format, the method according to the present disclosure can also be optimized with respect to the distribution of the various models between the various computing units.

Therefore, according to one preferred exemplary embodiment there is provision that the sensor models are distributed between the fewest possible computing units of the simulator. As a result, the data transfer which is brought about by the exchange of environmental data is minimized. This procedure is advantageous because it can be assumed that the calculation of the sensor models is particularly costly solely because of the large amounts of data which are to be processed for this purpose, with the result that good load distribution is achieved automatically. It is additionally conceivable that the model part of the environmental model for the calculation of the dynamic data is also calculated on these computing units, with the result that the data transfer is minimized further. As a result of the concentration of the sensor models on the fewest possible computing units, identical data items have to be kept ready on only a few effected computing units, as a result of which a solution with little storage requirement is achieved.

An alternative further development of the method provides that a vehicle model and the sensor models which are associated with the vehicle model are stored on a computing unit and the directly accessible memory thereof, wherein there each vehicle model is preferably stored with its associated sensor models on a dedicated separate computing unit and is also calculated there with the scope of the simulation. As a result of this refinement, a logic assignment of sensor models to vehicle models is ensured and the communication between the computing units is reduced. In addition, in this way the number of necessary computing units is also reduced, since as a result an entire vehicle is calculated with the environmental sensors which can be assigned to it on one common computing unit. A further advantage is that the exchange of vehicle models is considerably simplified on the simulator, since only one computing unit is affected by such an exchange. In addition, the modeling is also given greater clarity.

According to a further refinement of the method there is provision that the control device function which is to be tested is implemented on a real control device, and the real control device is connected to the simulator via its control device I/O interface to a corresponding simulator I/O interface, and the simulated sensor data of the environmental sensors is transmitted to the real control device. As a result, the physically present control device and the control device function which is implemented thereon are tested in the form of a classic HIL simulation. In this case, it is desired that the various models are calculated on the simulator in real time, since the real control device is, of course, also operated in real time.

According to one alternative procedure, the control device function which is to be tested is implemented on a virtual control device, wherein the virtual control device receives the simulated sensor data of the environmental sensors via its virtual control device I/O interface within the scope of the simulation. The disclosed distribution of the sensor models between various computing units and the resulting increase in the simulation speed permit simulations to be carried out in compressed time here. It is therefore then possible, for example, to run through a large number of kilometers traveled which have to be simulated in a very short time period; for example a million kilometers could be processed in only 72 hours. The simulator can be implemented here with a PC or a cluster of PCs.

Furthermore, the distribution of the various models between the computing units of the simulator can be optimized by virtue of the fact that the first vehicle model and, if present, the further vehicle models, the sensor models and the environmental model are distributed, according to a first configuration, across the computing units and their directly accessible memories. This distribution can take place automatically, in a random fashion or according to specific distribution rules, but it could also be performed by the user. There is then also provision, that during a first simulation of the models between the computing units the utilization rate of the computing units is determined, and that on the basis of the determined utilization rates of the computing units the models are automatically redistributed to a further configuration, so that there is a resulting more uniform utilization rate of the computing units during the simulation of the models.

The task derived above is also achieved by a simulator which is configured to carry out the method according to the present disclosure.

DESCRIPTION OF THE DRAWINGS

In particular, there are now a large number of possible ways of further developing and refining the method according to the present disclosure. Reference is made in this respect to the patent claims which are dependent on patent claim 1, and to the description of preferred exemplary embodiments in conjunction with the drawings. In the drawings:

DETAILED DESCRIPTION

Figure 1:
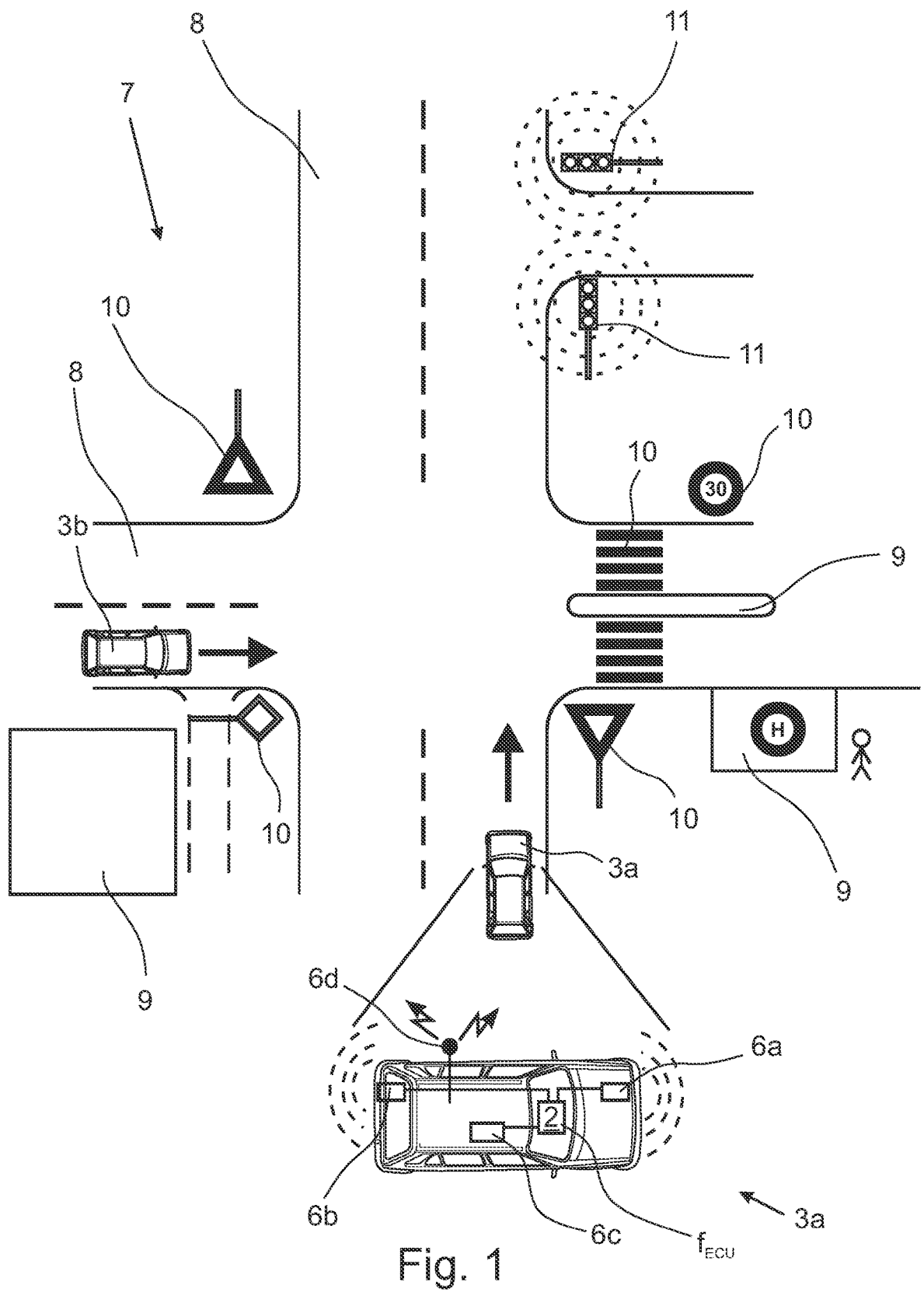
FIG. 1 shows a schematic view of vehicles with environmental sensors in surroundings representing a traffic situation.

FIGS. 2 to 9 respectively illustrate a method 1 for testing at least one control device function $f_{ECU}$ of at least one control device 2 of at least a first vehicle 3a by means of a simulator 5 having a plurality of computing units 4, 4a, 4b, 4c.

FIG. 1 shows a schematic view of the conditions and peripheral circumstances which are to be modeled by means of a simulation of traffic situations within a simulator 5. Firstly, at the bottom of the diagram a first vehicle 3a with a control device 2 can be seen in a schematic form. A multiplicity of environmental sensors 6, specifically radar sensors 6a, 6b, a camera 6c oriented in the direction of travel and a radio receiver 6d, which serves, for example, to receive position data and movement data of further vehicles 3b, are connected to the control device 2. The surroundings 7 comprises a traffic situation with roads 8, buildings and structural traffic control installations 9, road signs 10 and illuminated signs 11.

While the vehicles 3a, 3b move through the surroundings 7, the environmental sensors 6 supply a multiplicity of sensor data items with which the control device 2 is supplied. The connections between the environmental sensors 6 and the control device 2 are symbolized here as signal lines—that is to say as fixed connections—but they can also be radio links in so far as this is technically possible and permissible.

The control device function $f_{ECU}$ which is implemented in the control device 2 processes at least some of the sensor data as input variables. It is of interest whether the control device function $f_{ECU}$ which is implemented in the control device 2 functions as desired—that is to say according to the specifications. In order to be able to discover this within the framework of a simulation on the simulator 5, the components which are involved are modeled functionally by means of mathematical models and are calculated on the computing units 4 of the simulator 5.

Figure 2:
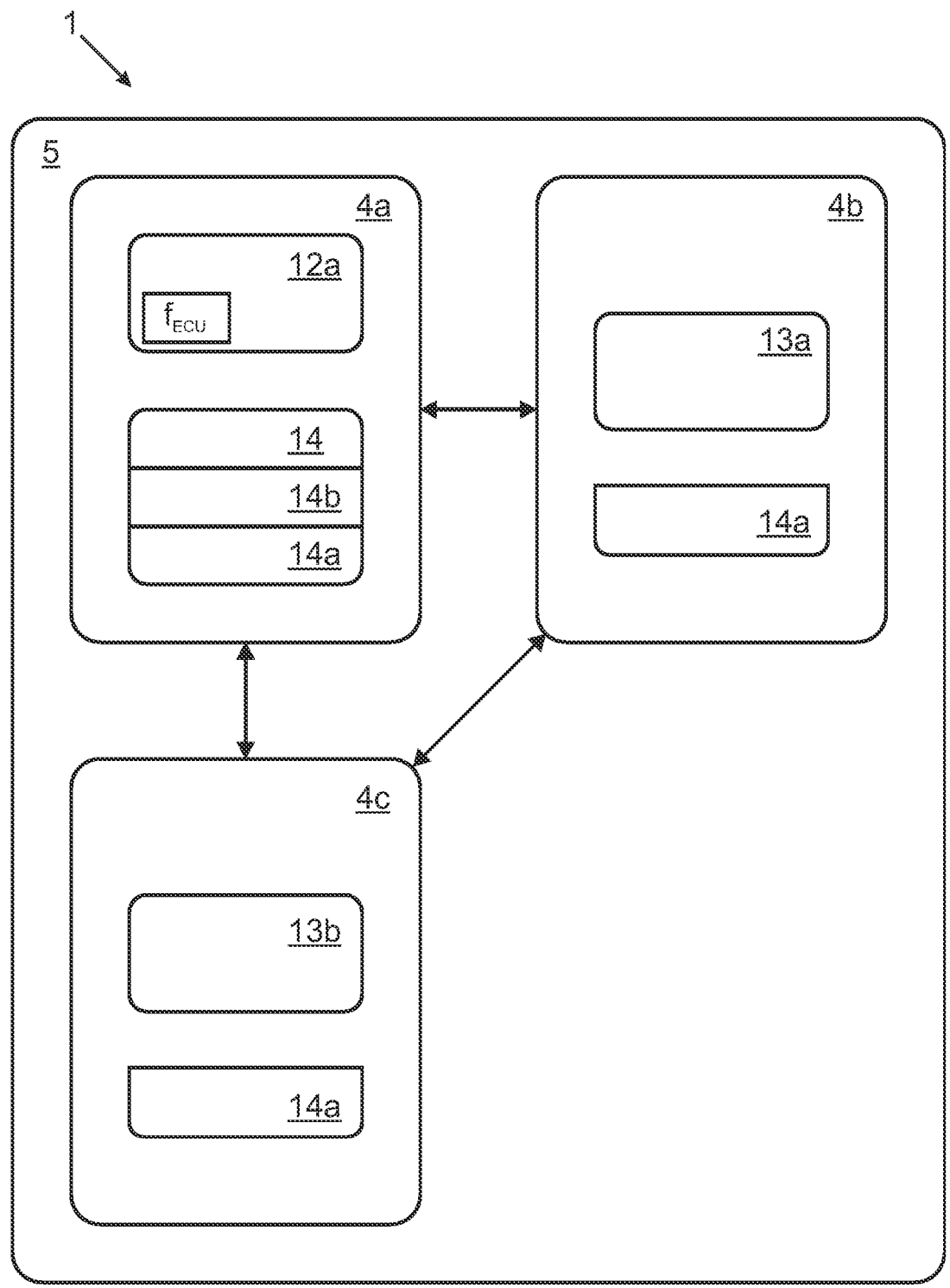
FIG. 2 shows a schematic view of a simulator for carrying out the method according to the present disclosure with sensor models which require static environmental data, on various computing units.

The calculation of the traffic situation according to FIG. 1, which is explained by way of example, using the simulator 5 will now be described with reference to FIG. 2. Firstly, the first vehicle 3a is modeled by means of a first vehicle model 12a. In this case, the vehicle model 12a also comprises a model (not expressly illustrated here) of the control device 2 and also the control device function $f_{ECU}$ which is implemented there and is of interest. If further vehicles 3b are involved in the simulation, they are described in the form of further vehicle models 12b (see FIG. 3). The environmental sensors 6, 6a, 6b are modeled by means of sensor models 13, 13a, 13b, and the surroundings 7 are described by means of an environmental model 14.

The environmental model 14 comprises static environmental data 14a and dynamic environmental data 14b. The static environmental data 14a describes static, immobile objects or else the static invariable dimensions of moving objects, but not their variable position data; this therefore comprises road profiles, structural objects, objects for controlling the traffic, road signs, dimensions of vehicles. The dynamic environmental data 14b comprises, for example, the variable position data of vehicles 3, other road users such as pedestrians or cyclists or road signs which vary over time, such as, for example, light signal systems 11.

Which of the objects of the environmental model are to be featured as static ones and which as dynamic data and which data items can be converted into a suitable data structure format before the simulation is stored according to the present disclosure for the modeling surroundings—e.g. by means of additional information on the selectable objects. This applies correspondingly to imported data and objects which are produced therefrom.

As is readily apparent, the various models 12, 13 and 14 are distributed between the various computing units 4a, 4b, 4c of the simulator 5. The simulator 5 is a multiprocessor system here.

The computing units 4 of the simulator 5 can exchange information with one another, which is indicated by the double arrows in all the figures. The computing units 4 each also comprise a respectively directly accessible memory, which is not illustrated separately here, nor is there any illustration of microprocessors or other computing devices within the scope of the computing units 4. A memory which can be accessed directly by the computing units is meant to refer, for example to a directly addressable main memory which can be accessed within a few cycles, or else the random access memory (RAM) of a computing core. The access to the directly accessible memory by the computing units 4 is accordingly extremely rapid, at any rate extremely rapid compared to access to a nondirectly accessible memory, that is to say, for example, to the memory of another computing unit which can only be accessed via the external data channel (double arrows between the computing units 4a, 4b, 4c). In the general case, the sensor models 13 receive the static environmental data 14a and/or dynamic environmental data 14b as input variables.

Within the scope of the present disclosure it has been recognized that the exchange of data between the computing units 4a, 4b, 4c within the scope of the simulation on the simulator 5 has a decisive significance, and the exchange of data can determine whether a simulation can be carried out very rapidly or rather slowly. In order to achieve the highest possible simulation speed during a calculation on a simulator 5 having a plurality of computing units 4, there is provision in all the methods 1 according to FIGS. 2 to 9 that the sensor models 13, 13a, 13b are distributed between at least two computing units 4, 4a, 4b, 4c with their respectively directly accessible memories.

In addition, there is provision that there is identification of the computing units 4b, 4c which have sensor models 13a, 13b which have static environmental data 14a as input variables. For the purpose of the simulation, the static environmental data 14a is then stored in the directly accessible memories of the identified computing units 4b, 4c. After storage of the static environmental data 14a has been concluded, the simulation of the models 12, 13, 14 on the computing units 4 with their respectively directly accessible memories is started synchronously. As a result of this distribution of the models it is possible that the sensor models 13, 13a, 13b which require static environmental data 14a as input variables which use the static environmental data 14a of that identified computing unit 4b, 4c on which the respective sensor models 13a, 13b are themselves located. The sensor models 13a, 13b can therefore benefit from the rapid access to the directly accessible memory. Accordingly, transmission of the static environmental data 14a between the computing units 4, 4a, 4b, 4c of the simulator 5 during the simulation is neither needed nor performed. As a result, a large speed effect is achieved since the static environmental data 14a is of considerable size compared to the dynamic environmental data 14b. As a result, the desired simulation is in many cases only made possible, for example, if the simulation is based on speed requirements, in the case of classic HIL simulations this is the requirement for a real time simulation.

Taking into account this general teaching with respect to the distribution of, in particular, the sensor models 13a, 13b which have static environmental data 14a as input variables, various types of model distribution with different advantages are conceivable. The exemplary embodiment according to FIG. 2 has, for example, the effect that the sensor models 13, 13b are distributed between the computing units 4b, 4c of the simulator 5 in such a way that the affected computing units 4b, 4c calculate exclusively the sensor models 13a, 13b.

Figure 3:
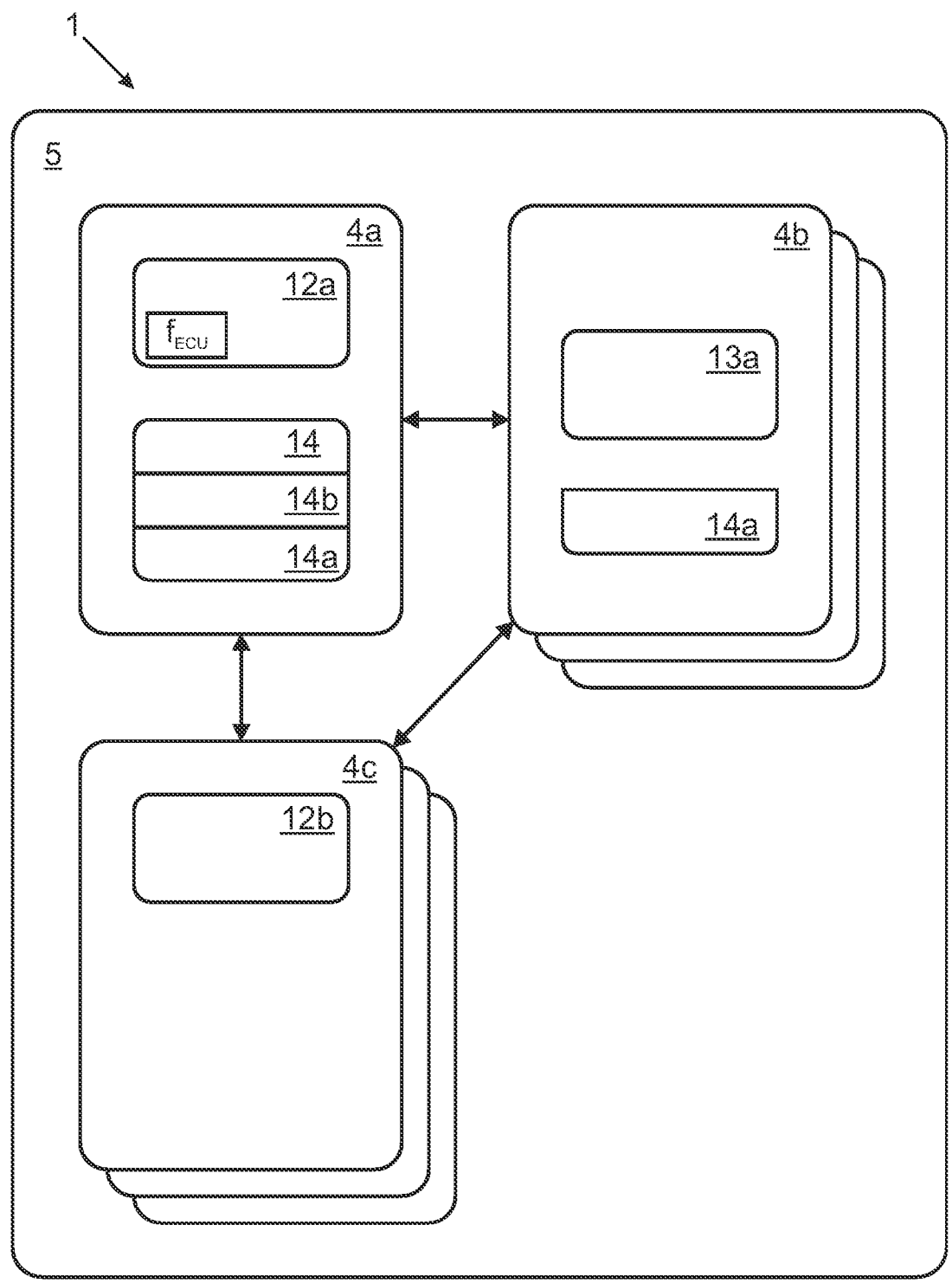
FIG. 3 shows a schematic view of a simulator for carrying out the method according to the present disclosure with a plurality of vehicle models.

FIG. 3 illustrates that the simulation on the simulator 5 can also comprise a plurality of vehicle models 12a, 12b. In the illustrated exemplary embodiment, each further vehicle model 12b is calculated on a further computing unit 4c (symbolized by the blocks which are fanned out one behind the other). Such sensor models 13a which require static environmental data 14a as input variables are calculated on other computing units 4b (also illustrated as blocks which are fanned out behind one another. In the illustrated exemplary embodiment, the vehicle models 12 and the sensor models 13 are calculated independently of one another on different computing units 4. If the computing power of the computing unit 4b permitted, a plurality of sensor models 13 could also be calculated on a single computing unit 4b, as a result of which the use of computing units 4b could be reduced. The same applies, of course, correspondingly to the calculation of vehicle models 12; here it is also possible to calculate a plurality of vehicle models 12 on a single computing unit 4 if the computing power of the affected computing unit 4 permits it.

Figure 4:
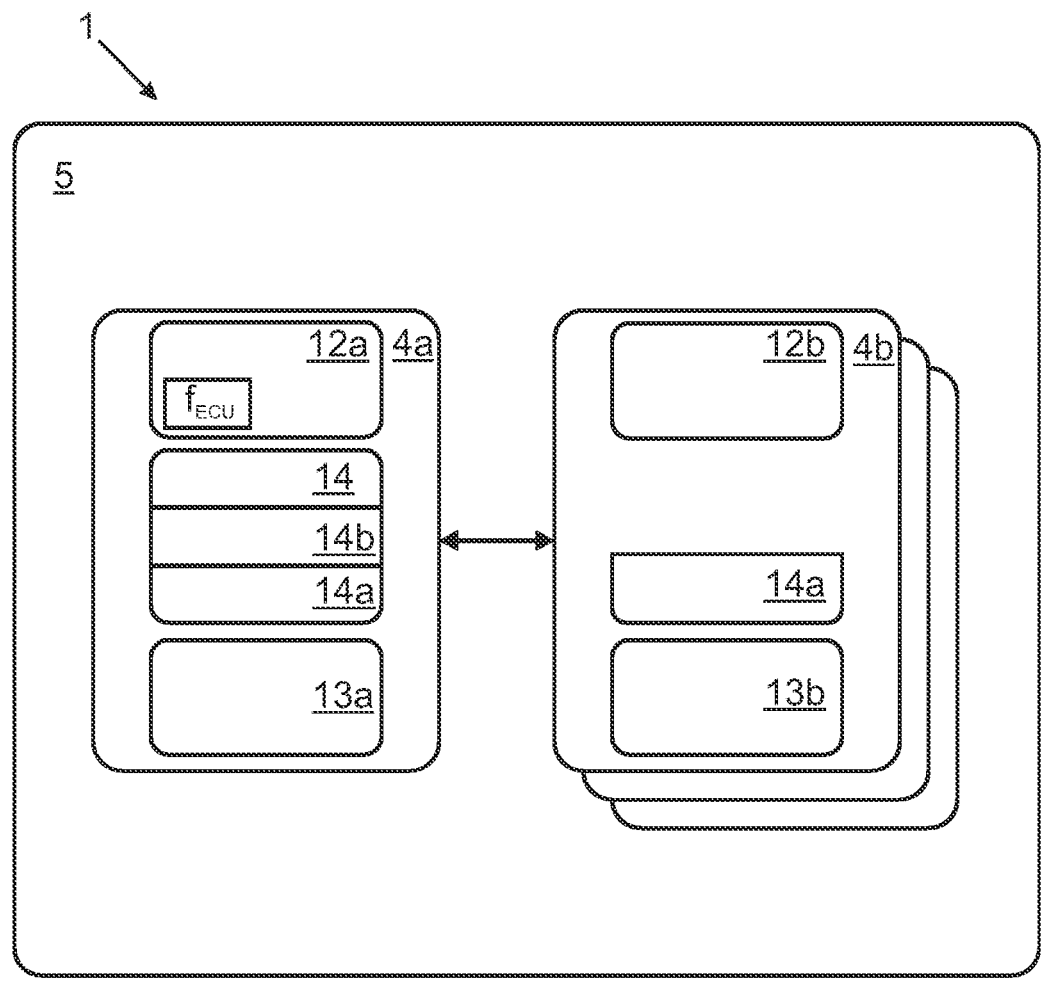
FIG. 4 shows a simulator with distribution, centered on vehicle models, between various computing units.

FIG. 4 illustrates a different possible variant of the distribution of models 12, 13, 14 between different computing units 4. The distribution is based on the idea that a vehicle model 12a, 12b and the sensor models 13a, 13b which are associated with the vehicle model 12a, 12b are stored on a computing unit 4a, 4b and the directly accessible memory thereof. Each vehicle model 12a, 12b is even stored with its associated sensor models 13a, 13b on a separate computing unit 4a, 4b in the present case. It is advantageous to maintain the logical relationship between the various models, for example, for the sake of easy exchangeability of a vehicle model 12, since here in each case only a single computing unit 4 has to be processed when a vehicle model 12 is exchanged. This increases the modulatory and the maintenance capability of the simulation and of the simulation structure.

FIGS. 5 to 8 illustrate different variants and refinements of the idea that before the start of the simulation the static environmental data 14a is transformed from a raw format $E_{stat,R}$ into a data structure format $E_{stat,S}$. The raw format $E_{stat,R}$ of the static environmental data 14a is a general description of the static environmental data which is not intended for a specific simulation environment or for a specific hardware. In order to make this data accessible and interpretable at the computing units 4 of the simulator 5, said data must be transformed into the data structure format $E_{stat,S}$. This transmission process is comparatively time-consuming and is therefore exported from the simulation sequence and made to precede the execution of the simulation. This makes possible a considerable saving in time, in particular if simulations are carried out again on the same model basis. Before the start of the simulation at the computing units 4, it is checked within the scope of the synchronization, for example, whether a processor-specific flag which indicates that the static environmental data is present in the data structure format $E_{stat,S}$ is set at all the identified computing units 4b, 4c.

Figure 5:
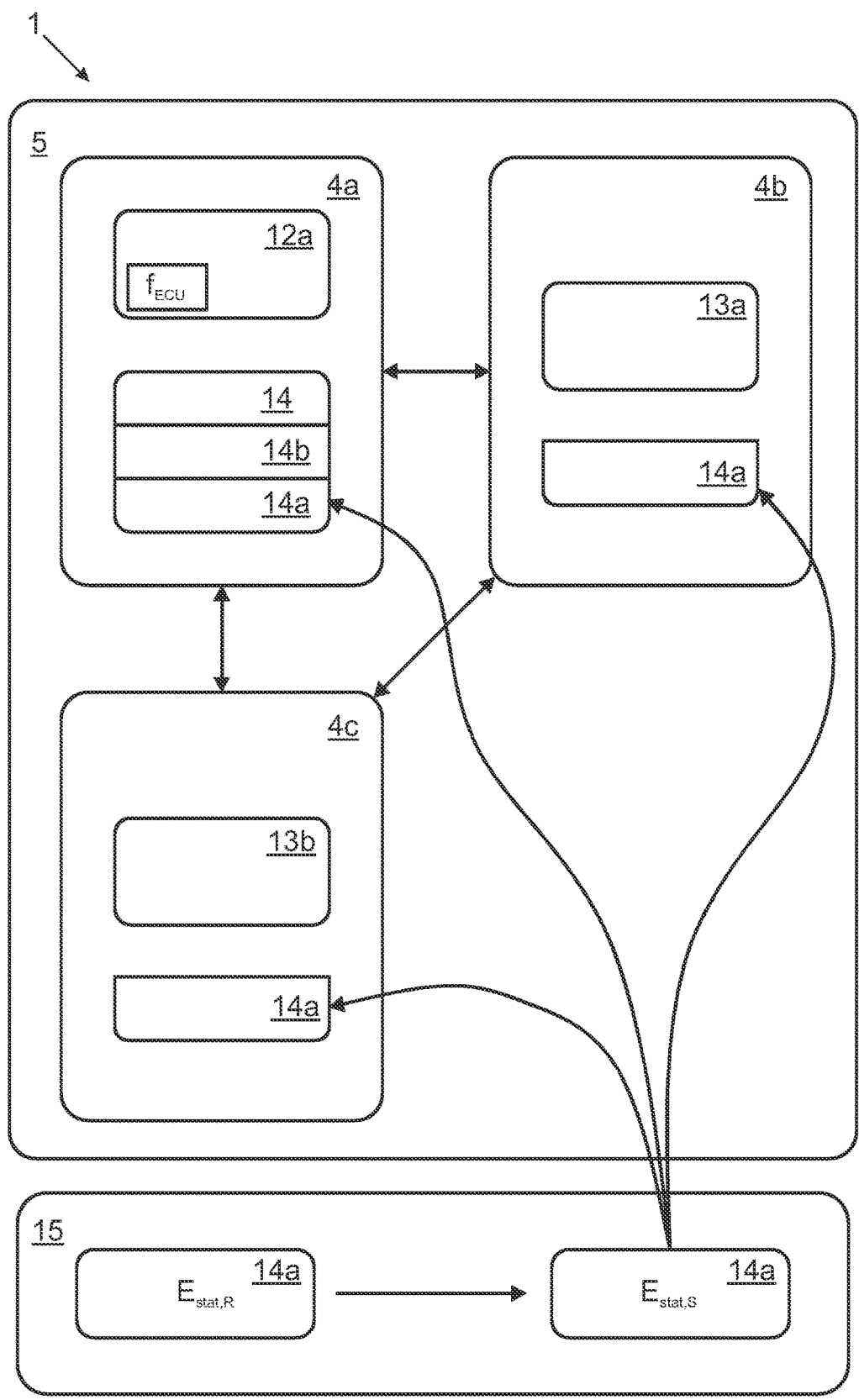
FIG. 5 shows a simulator according to FIG. 2 with the conversion of static environmental data from a raw format into a data structure format on a host computer.

In the exemplary embodiment according to FIG. 5 there is provision that before the storage in the directly accessible memories of the identified computing units 4b, 4c the static environmental data 14a is transformed from a raw format $E_{stat,R}$ into a data structure format $E_{stat,S}$ on a host computer 15. The transformed static environmental data 14a is then transmitted from the host computer 15 to the individual computing units 4a, 4b, 4c. In addition to the identified computing unit 4b, 4c, the computing unit 4a also receives the static environmental data 14a, since the entire environmental model 14 is calculated on it. For the transformation, the host computer 15 must have precise knowledge of the software and hardware conditions at the computing units 4. If the simulator 5 had, for example, a further computing unit on which just one vehicle model were calculated, the static environmental data would not be transmitted to this computing unit.

Figure 6:
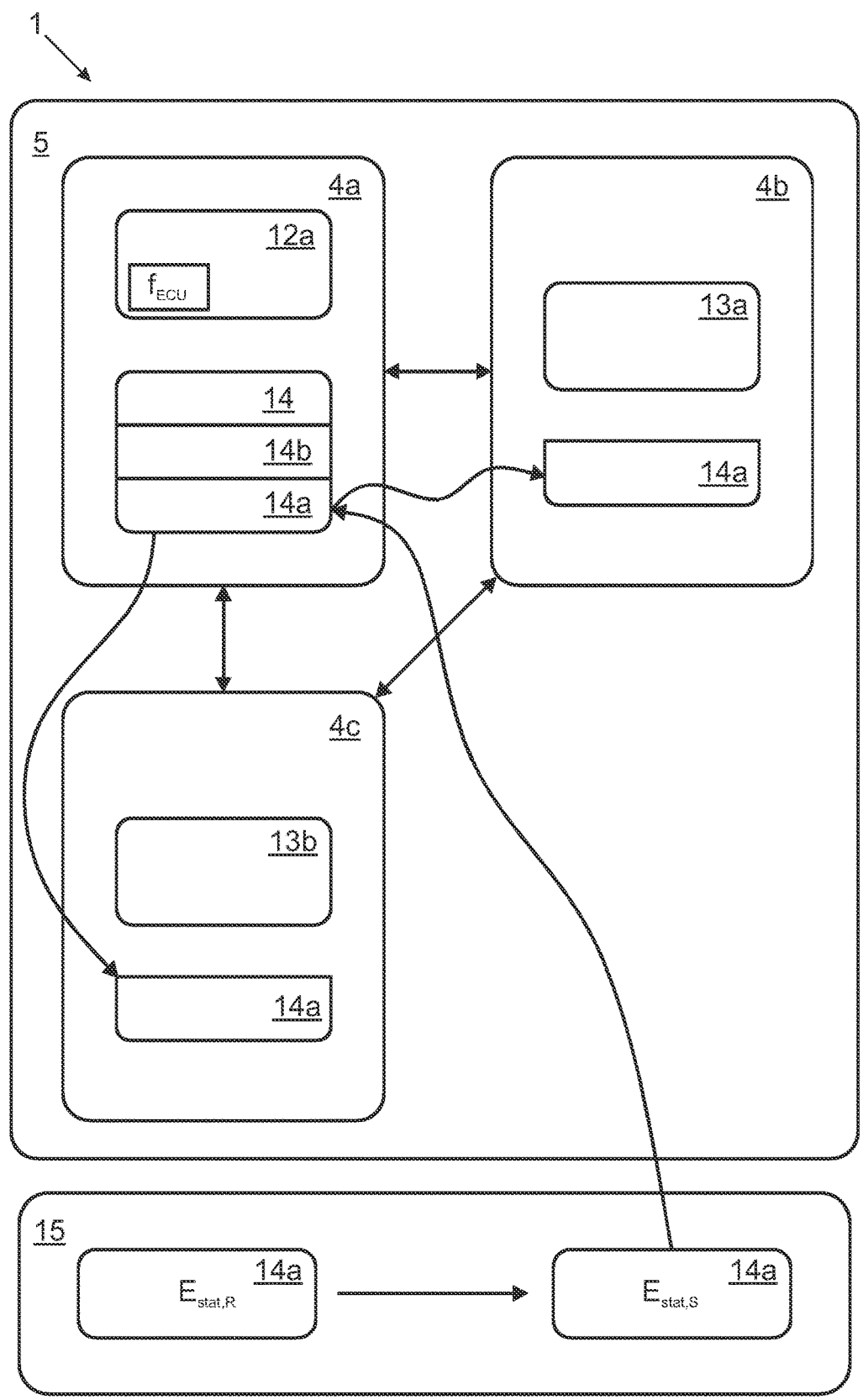
FIG. 6 shows the exemplary embodiment according to FIG. 5 with an alternative distribution of the environmental data in a data structure format between the computing units.

The exemplary embodiment according to FIG. 6 shows a variant of the distribution scheme of the static environmental data 14a according to FIG. 5. Here, the static environmental data 14a which is transformed into a data structure format $E_{stat,S}$ at the host computer 15 is transmitted into the memory of a computing unit 4a and transmitted from there into the directly accessible memory of the further identified computing units 4b, 4c and stored there. Otherwise, the conditions correspond to those in FIG. 5.

Figure 7:
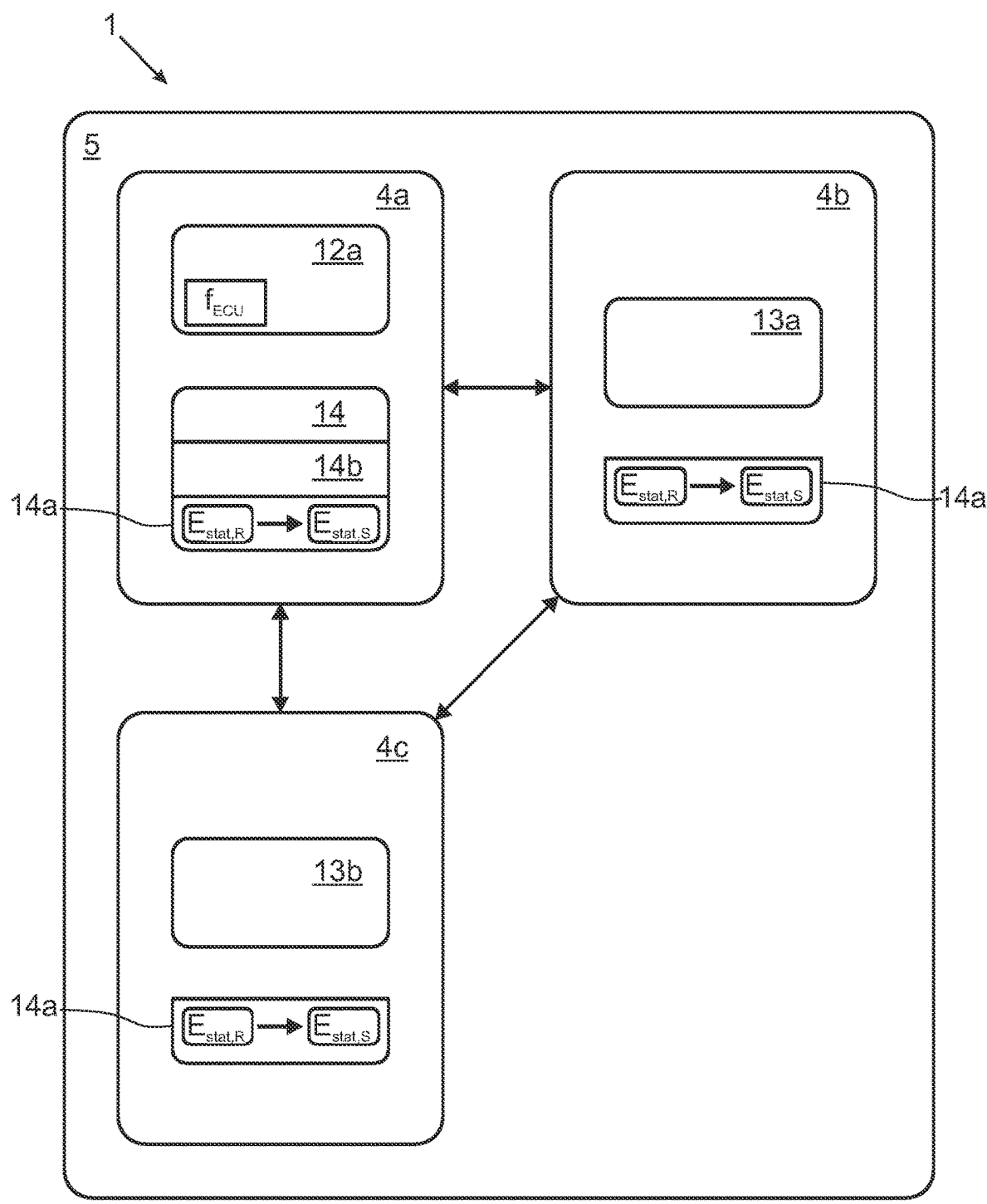
FIG. 7 shows a simulator with various computing units and an alternative conversion of static environmental data from a raw format into a data structure format.

Another strategy is pursued by the method according to FIG. 7. Here, the static environmental data 14a is firstly stored in the raw format $E_{stat,R}$ in the directly accessible memory of an identified computing unit 4 or in the directly accessible memories of a plurality of identified computing units 4a, 4b, 4c. There, the static environmental data 14a which is present in the raw format $E_{stat,R}$ is then transformed into a data structure format $E_{stat,S}$ by the respective computing unit 4, 4a, 4b, 4c. This procedure is suitable, in particular, in the case of heterogeneous hardware with different computing units 4, 4a, 4b, 4c. Particularities which are dependent on the hardware of the respective computing unit 4 are taken into account here in a quasi automatic fashion.

Figure 8:
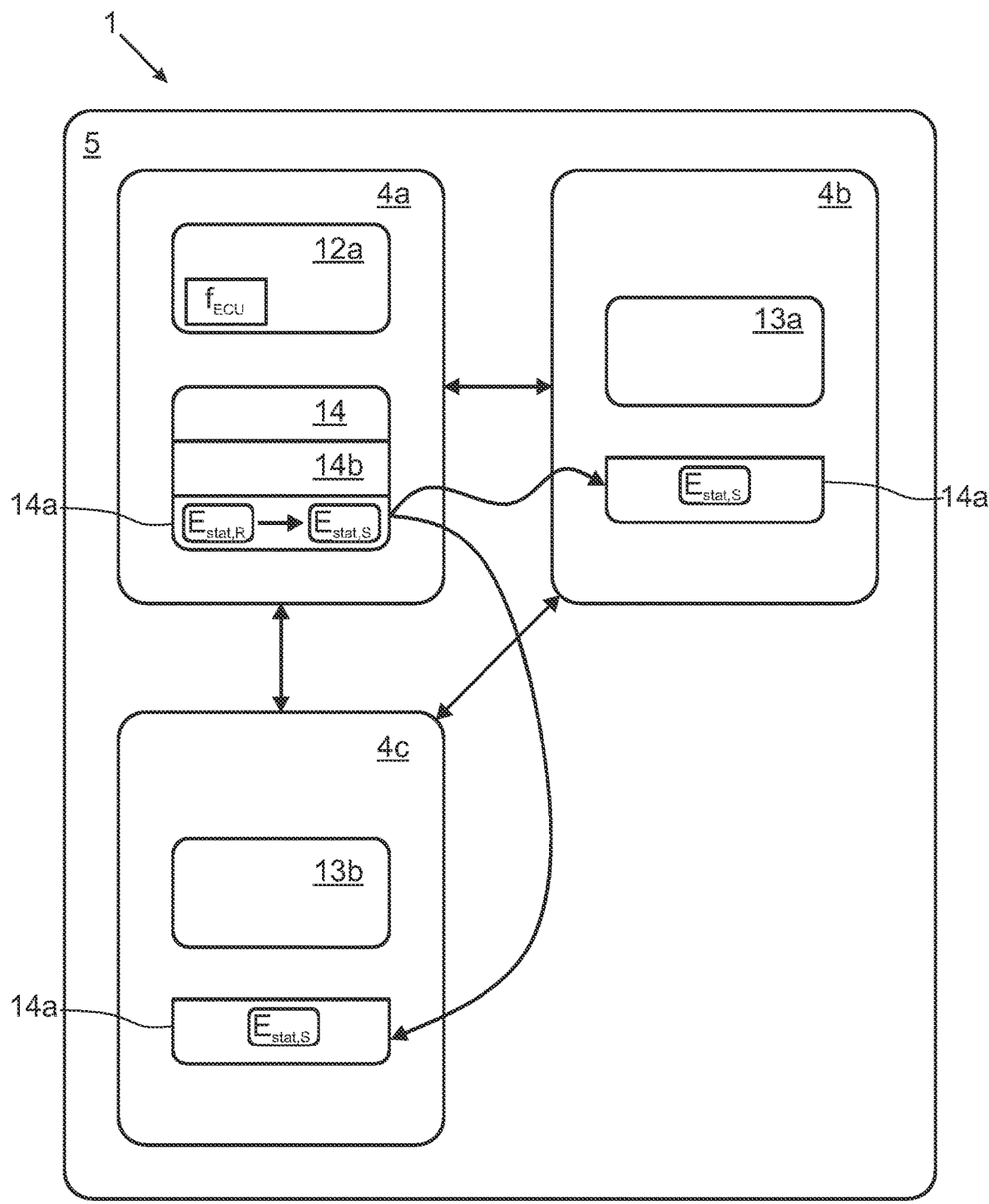
FIG. 8 shows a simulator with an alternative conversion and distribution of static environmental data between the computing units.
Figure 9:
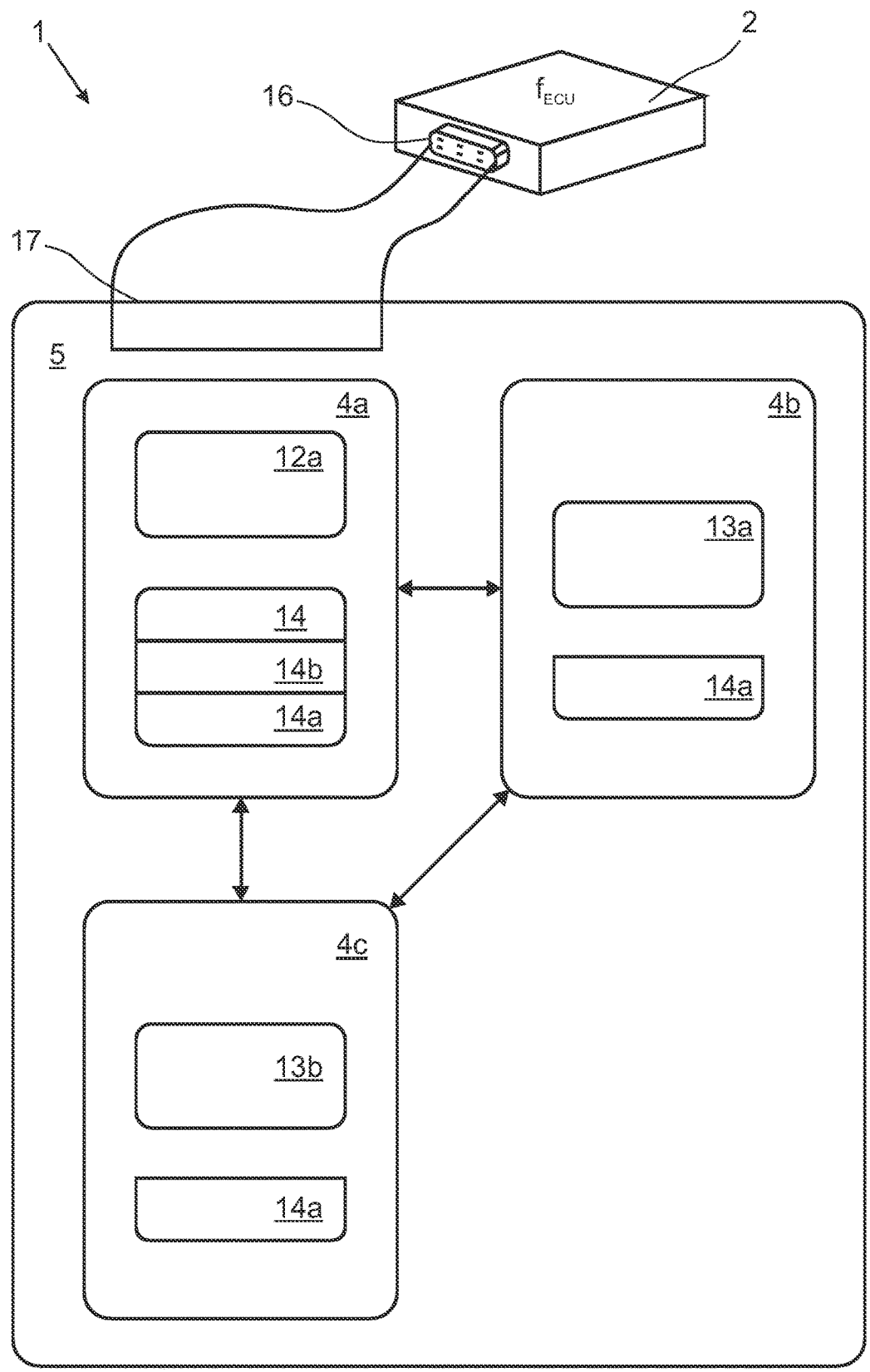
FIG. 9 shows a simulator with a connected real control device for testing a control device functionality.

The refinement according to FIG. 8 is suitable, in particular, when the computing units 4, 4a, 4b, 4c are comparable, with the result that the transformation of the static environmental data 14a can be performed representatively only on one computing unit 4a, wherein the transformation result in the form of the static environmental data 14a can then also be used in the data structure format $E_{stat,S}$ for the other computing units 4b, 4c. There is therefore provision that the static environmental data 14a can be transformed by the computing unit 4a from a raw format $E_{stat,R}$ into a data structure format $E_{stat,S}$ in the directly accessible memory of one computing unit 4a, and can be transmitted from this computing unit 4a to the identified computing units 4b, 4c and stored there.

In FIGS. 2 to 8, the control device has always appeared as a component of the vehicle model 12a. However, in the exemplary embodiment according to FIG. 9 the control device 2 is present in a real form, that is to say not in the form of a virtual control device. The control device function $f_{ECU}$ is therefore implemented in the control device 2. In order to be able to test the control device function $f_{ECU}$, the corresponding input variables have to be made available via corresponding interfaces. The procedure here is consequently that the control device function $f_{ECU}$ which is to be tested is implemented at the real control device 2, and the real control device 2 is connected to the simulator 5 via its control device I/O interface 16 to a corresponding simulator I/O interface 17, and the simulated sensor data of the sensor models 13 is transmitted to the real control device 2. Conversely, the simulator 5 can also receive signals which are calculated on the control device 2 and output by the control device 2 and feed them to the further simulation.

LIST OF REFERENCE SYMBOLS

1 Method
2 Control device
3 Vehicles
3a Vehicle
3b Vehicle
4 Computing units
4a Computing unit
4b Computing unit
4c Computing unit
5 Simulator
6 Environmental sensors
6a Environmental sensor
6b Environmental sensor
6c Environmental sensor
6d Environmental sensor
7 Surroundings
8 Road
9 Building
10 Road signs
11 Illuminated signs
12 Vehicle models
12a Vehicle model
12b Vehicle model
13 Sensor models
13a Sensor model
13b Sensor model
14 Environmental model
14a Static environmental data
14b Dynamic environmental data
15 Host computer
16 Control device I/O interface
17 Simulator I/O interface
$E_{stat,R}$ Raw format
$E_{stat,S}$ Data structure format
$f_{ECU}$ Control device function

What is claimed is:

1. A method for testing at least one control device function of at least one control device of at least one first vehicle by means of a simulator having a plurality of computing units, the first vehicle having at least one environmental sensor, the method comprising:

a multiplicity of environmental sensors of the first vehicle and/or of at least one further vehicle supplying the at least one control device and/or further control devices with sensor data of the environmental sensors, the at least one control device function processing at least some of the sensor data as input variables, and the first vehicle and, if present, the further vehicles being located in surroundings which represent a traffic situation, the first vehicle being simulated by means of a first vehicle model, and, if present, the further vehicles being simulated by means of further vehicle models the environmental sensors being simulated by means of sensor models, and the surroundings being simulated by means of an environmental model with the computing units of the simulator, the models being distributed alone or in groups between at least two computing units, each with a directly accessible memory, wherein the environmental model comprising static environmental data and dynamic environmental data, the sensor models having, as input variables, the static environmental data and/or dynamic environmental data, wherein, the sensor models are distributed between at least two computing units, each with their directly accessible memories, wherein there is identification of the computing units which have sensor models which have static environmental data as input variables, wherein the static environmental data is stored in the directly accessible memories of the identified computing units, wherein, after the storage of the static environmental data has been completed the simulation of the models on the computing units with their respectively directly accessible memories is started synchronously, wherein the sensor models which have the static environmental data as input variables use the static environmental data of the identified computing unit which has its directly accessible memory and on which the respective sensor models are themselves located.

2. The method of claim 1, wherein before the start of the simulation the static environmental data is transformed from a raw format into a data structure format.

3. The method of claim 2, wherein before storage in the directly accessible memories of the identified computing units the static environmental data is transformed from a raw format into a data structure format on a host computer.

4. The method of claim 3, wherein the static environmental data which is transformed into a data structure format on the host computer is transmitted into the memory of a computing unit, in particular into the directly accessible memory of an identified computing unit, and transmitted from there into the directly accessible memory of the further identified computing units and is stored there.

5. The method of claim 2, wherein after storage in the directly accessible memory of an identified computing unit or in the directly accessible memories of a plurality of identified computing units the static environmental data is transformed from a raw format into a data structure format by the respective computing unit.

6. The method of claim 5, wherein the static environmental data in the directly accessible memory of a computing unit, in particular in the directly accessible memory of an identified computing unit, is transformed from a raw format into a data structure format by the computing unit, and is transmitted from the computing unit to the identified computing units and stored there.

7. The method of claim 1, wherein the sensor models are distributed between the fewest possible computing units of the simulator.

8. The method of claim 1, wherein a vehicle model and the sensor models which are associated with the vehicle model are stored on a computing unit and the directly accessible memory thereof, in particular each vehicle model is stored with its associated sensor models on a separate computing unit.

9. The method of claim 1, wherein the control device function which is to be tested is implemented on a real control device, and the real control device is connected to the simulator via its control device I/O interface to a corresponding simulator I/O interface, and the simulated sensor data of the sensor models is transmitted to the real control device.

10. The method of claim 1, wherein the control device function which is to be tested is implemented on a virtual control device, and the virtual control device receives the simulated sensor data of the sensor models via its virtual control device I/O interface within the scope of the simulation.

11. The method of claim 1, wherein the first vehicle model and, if present, the further vehicle models, the sensor models and the environmental model are distributed, according to a first configuration, between the computing units and their directly accessible memories, wherein during a first simulation of the models on the computing units the utilization rate of the computing units is determined, and wherein on the basis of the determined utilization rates of the computing units the models are redistributed to a further configuration, so that there is a resulting more uniform utilization rate of the computing units during the simulation of the models.

12. A simulator which is configured to carry out the method of claim 1.

* * * * *